United States Patent
Shields et al.

(10) Patent No.: US 6,426,301 B1
(45) Date of Patent: Jul. 30, 2002

(54) REDUCTION OF VIA ETCH CHARGING DAMAGE THROUGH THE USE OF A CONDUCTING HARD MASK

(75) Inventors: Jeffrey A. Shields, Sunnyvale; Ramkumar Subramanian, San Jose; Bharath Rangarajan, Santa Clara; Allen S. Yu, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/628,822

(22) Filed: Jul. 31, 2000

(51) Int. Cl.⁷ .............................................. H01L 21/302
(52) U.S. Cl. ...................... 438/706; 438/720
(58) Field of Search .................. 438/706, 712, 438/720, 725, 737, 738

(56) References Cited

U.S. PATENT DOCUMENTS

| | | | |
|---|---|---|---|
| 5,030,589 A | 7/1991 | Noda | 437/192 |
| 5,173,442 A | 12/1992 | Carey | 437/173 |
| 5,821,169 A | 10/1998 | Nguyen et al. | 438/736 |
| 5,843,827 A * | 12/1998 | Gregor et al. | 438/301 |
| 5,846,884 A * | 12/1998 | Naeem et al. | 438/714 |
| 5,904,562 A | 5/1999 | Nulman | 438/654 |

* cited by examiner

Primary Examiner—Benjamin L. Utech
Assistant Examiner—Kin-Chan Chen
(74) Attorney, Agent, or Firm—Amin & Turocy, LLP (57) ABSTRACT

A wafer having a substrate and an insulating layer over the substrate that includes a conductive layer over the insulating layer. The conductive layer mitigates charges formed on a photoresist layer during etching of features (e.g., vias and trenches). Any conductive material may serve this purpose. For example, aluminum, tantalum nitride, titanium and titanium nitride. Typically, a plasma etcher is employed for forming vias and trenches in an insulating layer to create contacts and conducting lines used to connect devices residing within different layers. The plasma etcher causes charge buildup on a photoresist layer that is utilized during the etching process. The charge buildup causes potential differences on the photoresist layer, which can lead to eventual damage of devices. A conductive layer eliminates this potential differences because a charge equilibrium is established due to the conductivity of the conductive layer.

20 Claims, 9 Drawing Sheets

REDUCTION OF VIA ETCH CHARGING DAMAGE THROUGH THE USE OF A CONDUCTING HARD MASK

TECHNICAL FIELD

The present invention generally relates to semiconductor processing, and in particular to a method for improving a contact lithography process.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Present techniques in optical projection printing can resolve images of sub-micron when photoresists with good linewidth control are used. However, reflection of light from substrate/resist interfaces produce variations in light intensity and scattering of light in the resist during exposure, resulting in non-uniform photoresist linewidth upon development.

Constructive and destructive interference resulting from reflected light is particularly significant when monochromatic or quasi-monochromatic light is used for photoresist exposure. In such cases, the reflected light interferes with the incident light to form standing waves within the resist. In the case of highly reflective substrate regions, the problem is exacerbated since large amplitude standing waves create thin layers of underexposed resist at the wave minima. The underexposed layers can prevent complete resist development causing edge acuity problems in the resist profile. Antireflective coatings are known and used to mitigate the aforementioned problems, however, the use thereof presents additional problems such as, for example, introduction of particulate contamination, requirement of tight temperature tolerances during production, etc.

As contact dimensions shrink, charging damage during contact formation or during etching become more important. Charging damage can be caused by different contacts charging up due to non-uniformity in the etching plasma. If a sufficient voltage is attained between contact elements, a current can flow which damages the gate oxide of any transistors formed on the wafer being fabricated. This is known as electron shading. High density plasmas aggravate this effect by having a more severe "electron shading" effect where the contact openings in the resist charge up with electrons. Since both the resist and the dielectric layer are being etched during contact/via etch are insulating, the only ways to equalize the charge imbalances is with current flow. An insulating anti-reflective coating is sometimes employed on top of the dielectric layer, under the resist. This layer is also insulating and does not improve the situation.

Figure 1A:
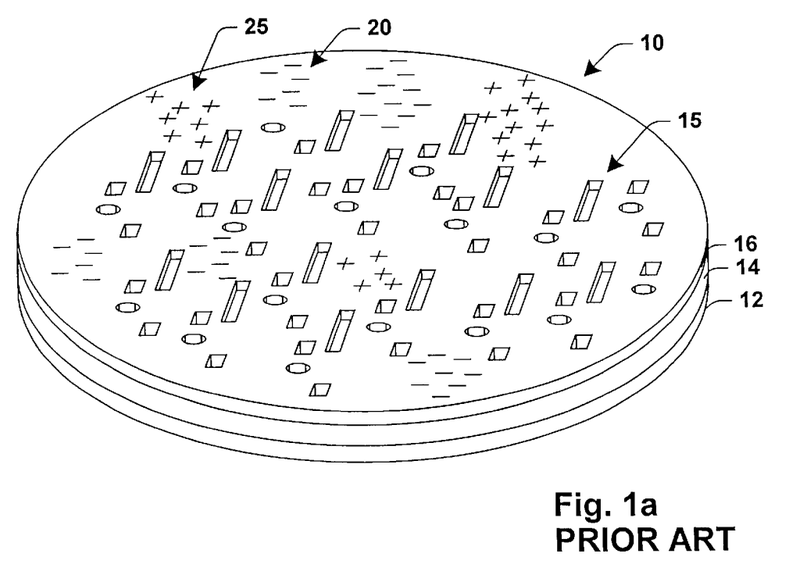
FIG. 1a is a perspective view of a semiconductor substrate covered with an oxide layer and a photoresist layer in accordance with a conventional process.
Figure 1B:
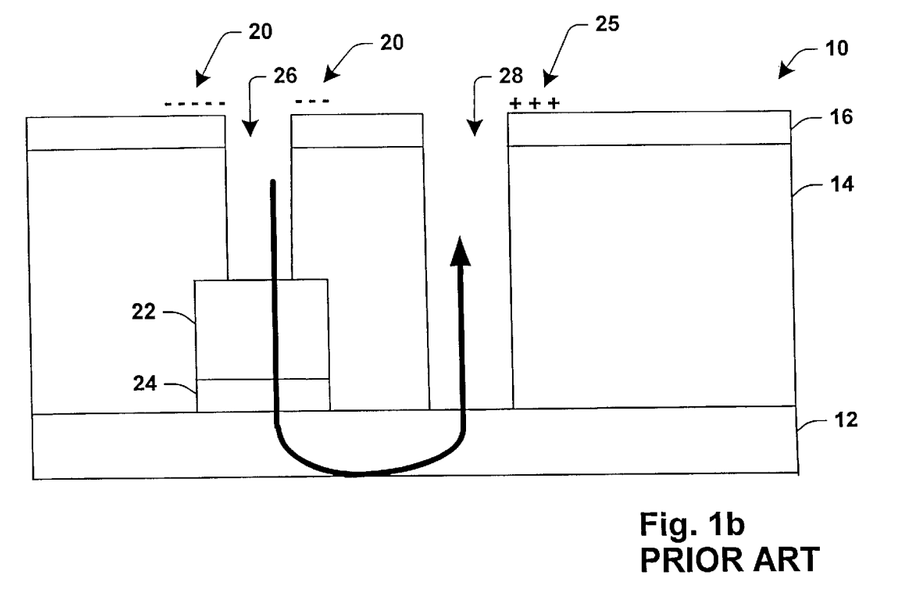
FIG. 1b is a cross-sectional view of the semiconductor substrate of FIG. 1a illustrating damages due to current flow from one via or trench to another in accordance with the conventional process.

FIG. 1a illustrates a prior art wafer 10 including a substrate layer 12, an oxide layer 14 disposed above the substrate layer 12 and a photoresist layer 16 disposed above the oxide layer 14. A plurality of features 15 have been etched through the resist layer 16 and the oxide layer 14. During the etching process, a plurality of negative charges 20 and a plurality of positive charges 25 build on the surface of the photoresist layer 16. FIG. 1b illustrates a cross-sectional view of the wafer 10. A gate 22 of a transistor (not shown) includes a gate oxide layer 24 located between the gate 22 and the substrate 12. The gate 22 and the gate oxide layer 24 are disposed in a first via or trench 26. A negative charge 20 has built up around the first via or trench 26 during etching. A second via or trench 28 is disposed near the first via or trench 26 and has positive charge 25 that has built up around the second via or trench 28 during etching. The difference in the charge build up causes a voltage potential between the resist around the first via or trench 26 with respect to the second via or trench 28. This results in current flowing through the first via or trench 26 to the second via or trench 28. The current flow causes damage to the gate oxide layer 24 resulting in device defects. In view of the above, improvements are needed to mitigate the aforementioned problems.

SUMMARY OF THE INVENTION

The present invention provides for a wafer having a substrate and an insulating layer over the substrate that includes a conductive layer over the insulating layer. The conductive layer mitigates charges formed on a photoresist layer during etching of features (e.g., vias and trenches). Any conductive material may serve this purpose. For example, aluminum, tantalum nitride, titanium and titanium nitride. Typically, a plasma etcher is employed for forming vias and trenches in an insulating layer to create contacts and conducting lines used to connect devices residing within different layers. The plasma etcher causes charge buildup on a photoresist layer that is utilized during the etching process. The charge buildup causes potential differences on the photoresist layer, which can lead to eventual damage of devices. A conductive layer eliminates this potential differences because a charge equilibrium is established due to the conductivity of the conductive layer.

Ideally, this layer can serve as an antireflective (arc) as well, eliminating the need for a separate arc layer. Since this layer conducts, the layer will redistribute charge from a non-uniform plasma etch, preventing current flowing through the wafer features. Alternatively, the conductive layer may be grounded or held at a fixed potential by attaching a contact to a peripheral edge of the wafer and attaching the contact to a fixed potential. Additionally, a contact can be formed from the conductive layer to the top surface of the wafer and attached to a fixed potential. A contact can be also formed that attaches the underlying substrate layer to the conductive layer. The substrate layer acts as a ground to hold the conductive layer at a fixed potential. The contact can be coupled to a plate holding the substrate layer, which may act as a ground for the conductive layer. Preferably, the conductive layer will be both conducting and removable. One example of a film meeting this criteria is using a titanium nitride (TiN) antireflection coating (ARC). Other possible conductive layers include titanium, tantalum and tantalum nitride.

One aspect of the invention relates to a method for fabricating interconnecting lines and vias in a layer of insulating material. The method includes the steps of providing a substrate having an insulating layer and forming a conductive layer over the insulating layer. A photoresist layer is provided over the conductive layer and the photoresist layer is developed exposing portions of the conductive layer. The exposed portions of the conductive layer and underlying insulating layer are etched to form at least one opening extending to the substrate.

Another aspect of the present invention relates to a method for fabricating interconnecting lines and vias in a layer of insulating material. The method includes the steps of providing a substrate having an insulating layer and forming a conductive antireflective layer over the insulating layer. A photoresist layer is provided over the conductive antireflective layer. The photoresist layer is developed exposing portions of the conductive anti reflective layer. The exposed portions of the conductive antireflective layer are etched exposing portions of the insulting layer. The exposed portions of the insulating layer are etched to form a via. The photoresist layer is stripped and the conductive material layer is removed. The via is then filled with a contact material layer.

Yet another aspect of the present invention provides for a method for fabricating interconnecting lines and vias in a layer of insulating material. The method comprises the steps of providing a substrate having an insulating layer and forming a titanium nitride antireflective layer over the insulating layer. A coupling contact is formed from the antireflective layer to the substrate. A photoresist layer is provided over the titanium nitride antireflective layer and the photoresist layer is developed exposing portions of the antireflective layer. The exposed portions of the titanium nitride antireflective layer are etched exposing portions of the insulating layer. The exposed portions of the insulating layer are etched to form a via. The photoresist layer is stripped and the conductive material layer is removed. The via is then filled with a contact material layer. The contact material layer covers the insulating layer. The contact material layer is then polished back.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention involves making and using a conductive layer over a wafer to mitigate charge formed on a photoresist layer during the formation of features on the wafer caused by an etching process. Preferably, the conductive layer can be employed as an ARC layer during the etching process.

Figure 2A:
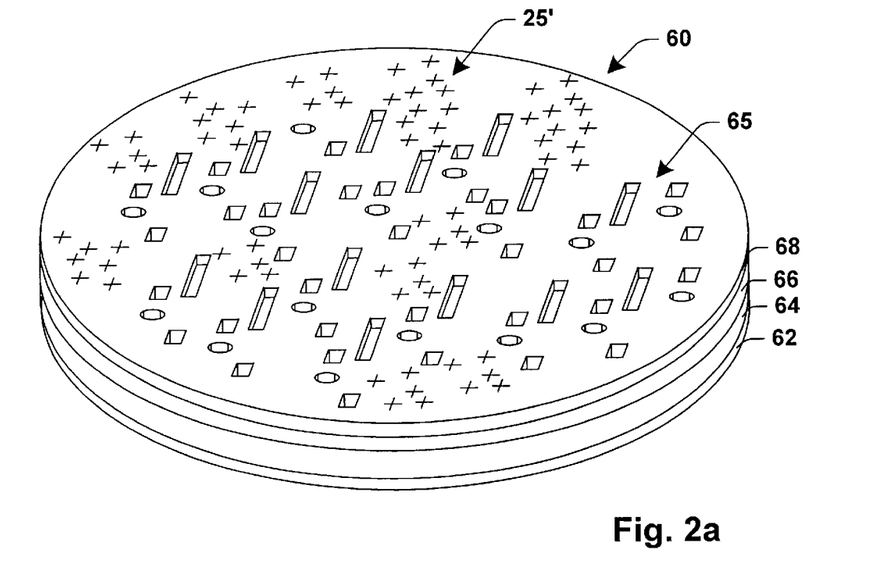
FIG. 2a is a perspective view of a semiconductor substrate covered with an oxide layer, a conductive layer and a photoresist layer in accordance with the present invention.
Figure 2B:
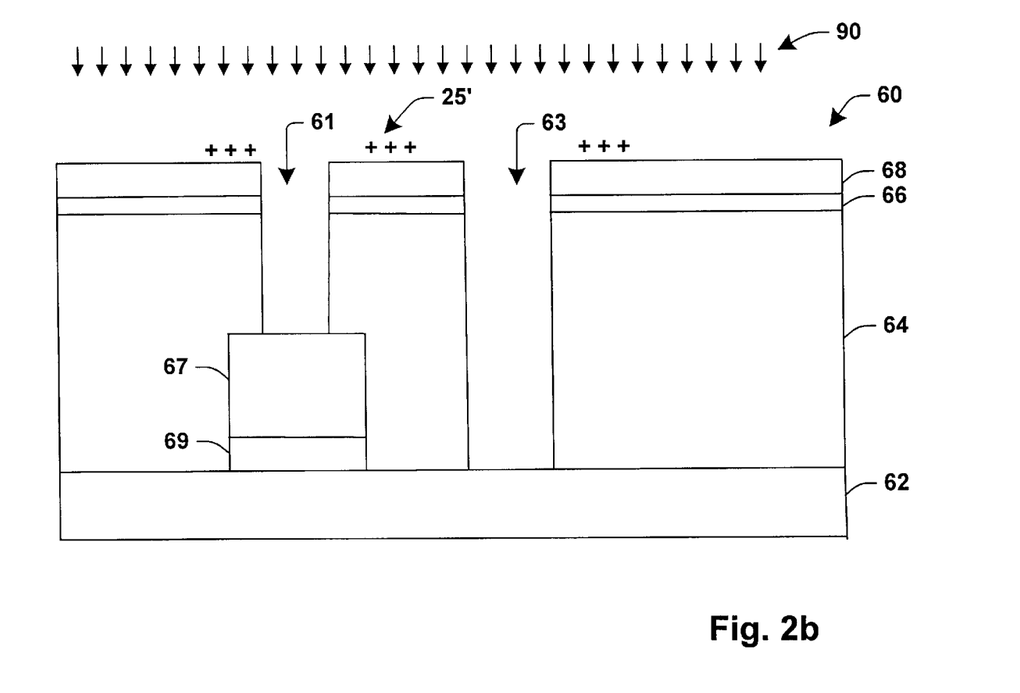
FIG. 2b is a cross-sectional view of the semiconductor substrate of FIG. 2a illustrating mitigated damages due to no current flow from one via or trench to another in accordance with the present invention.

FIG. 2a illustrates a wafer 60 including a substrate layer 62, an oxide layer 64 disposed above the substrate layer 62, a conductive layer 66 disposed above the oxide layer 64 and a photoresist layer 68 disposed above the conductive layer 66. A plurality of features 65 have been etched through the resist layer 68, the conductive layer 66 and the oxide layer 64. During an etching process 90, the conductive layer 66 redistributes charge 25' caused by the non-uniformity of the plasma etch. The redistributing of charge 25' prevents any differences in charge build up and voltage buildup that would occur due to the etching process. FIG. 2*b* illustrates a cross-sectional view of the wafer 60. A gate 67 of a transistor (not shown) includes a gate oxide layer 69 located between the gate 67 and the substrate 62. The gate 67 and the gate oxide layer 69 are disposed in a first via or trench 61. A second via or trench 63 is disposed near the first via or trench 61. Due to the conductivity of the conductive layer 66, the potential from one point on the conductive layer 66 to the next is held at a similar potential. Therefore, no differences in charge build up have resulted and current flowing through the first via or trench 61 to the second via or trench 63 is eliminated. Therefore, damage due to current flow through the gate oxide layer 69 is mitigated.

Figure 2C:
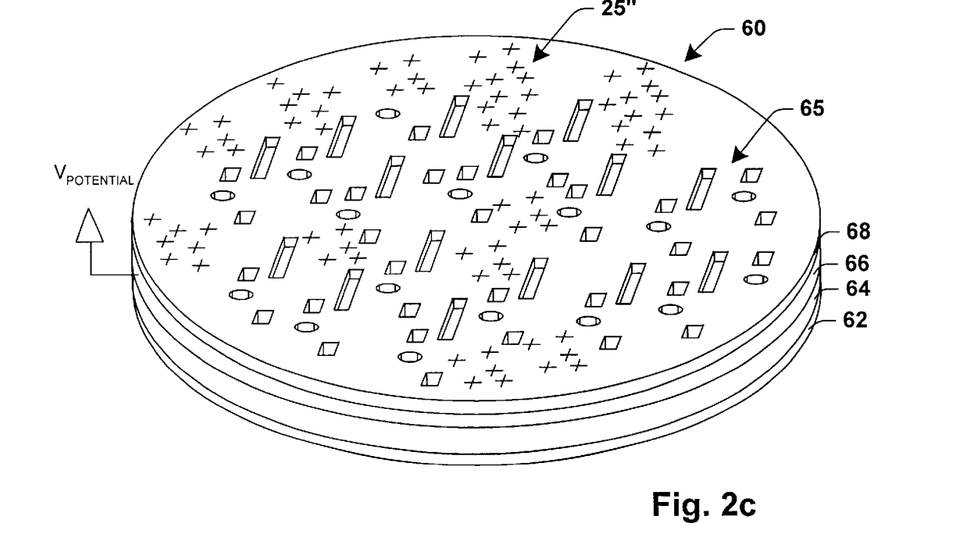
FIG. 2c is a perspective view of the structure of FIG. 2a with the conductive layer coupled to a fixed potential in accordance with the present invention.
Figure 2D:
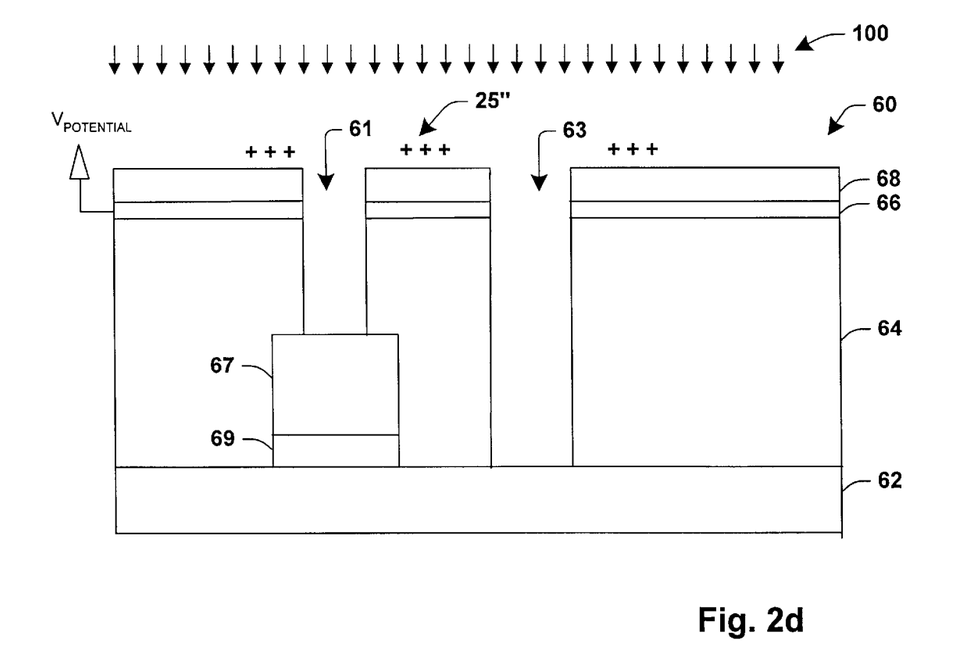
FIG. 2d is a cross-sectional view of the semiconductor substrate of FIG. 2c illustrating mitigated damages with the conductive layer coupled to a fixed potential in accordance with the present invention.

FIG. 2*c* illustrates the wafer 60 wherein the conductive layer 66 is held at a fixed potential. This can be accomplished by providing a contact to the conductive layer and connecting that contact to a fixed potential. Additionally, a mechanical clamp may be employed to connect the conductive layer 66 to a plate held at a fixed potential. The contact, the plate and/or the clamp may be connected to a fixed potential at the etcher, for example, the etcher ground. Various other methodologies may be employed to hold the conductive layer 66 at a fixed potential. During an etching process 100, the conductive layer 66 redistributes charge 25" caused by the non-uniformity of the plasma etch. FIG. 2*d* illustrates a cross-sectional view of the wafer 60. Due to the conductive layer 66 being held at a fixed potential, no differences in charge build up have resulted in current flowing through the first via or trench 61 to the second via or trench 63. Therefore, damage due to current flow through the gate oxide layer 69 is mitigated.

Figure 2E:
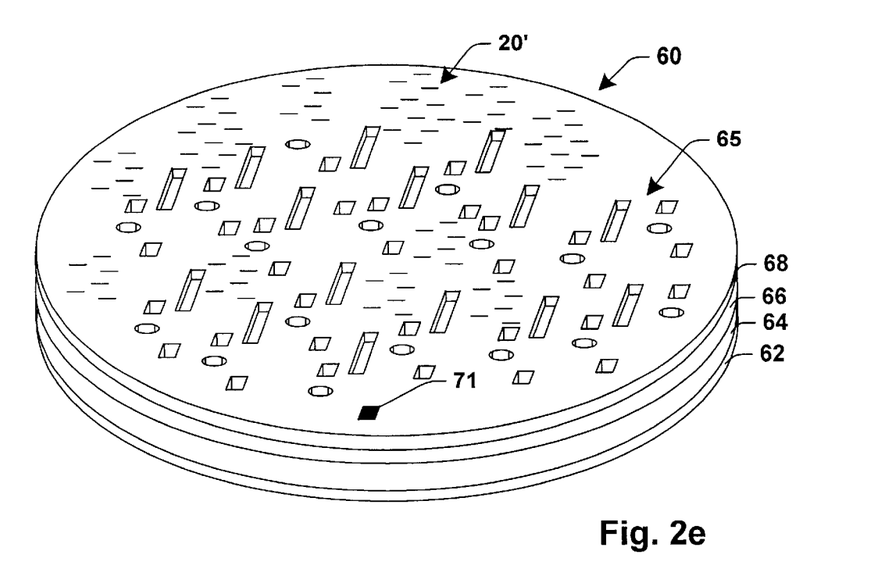
FIG. 2e is a perspective view of the structure of FIG. 2a with the conductive layer coupled to the substrate in accordance with the present invention.
Figure 2F:
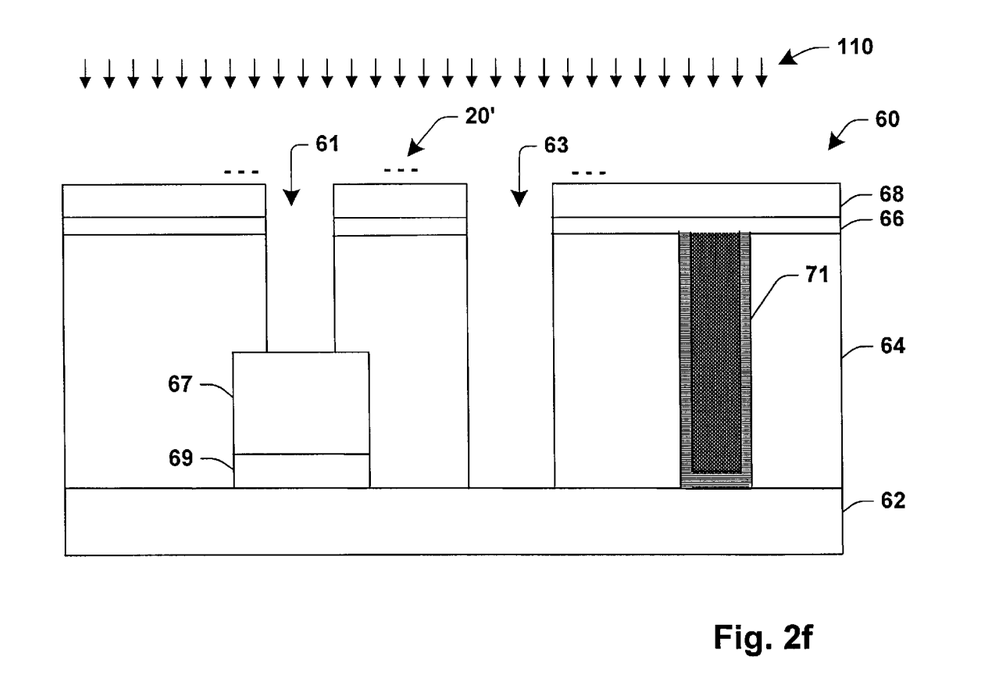
FIG. 2f is a cross-sectional view of the semiconductor substrate of FIG. 2e illustrating mitigated damages with the conductive layer coupled to the substrate in accordance with the present invention.

FIG. 2*e* illustrates the wafer 60 wherein the conductive layer 66 is coupled to the substrate 62 by a contact 71. The substrate 62 acts as a ground to hold the conductive layer 66 at a fixed or zero potential and redistribute charges 20'. Alternatively, the substrate 62 can be coupled to the ground of the plasma etcher. Various other methodologies may be employed to hold the substrate 62 at a fixed potential and thus, the conductive layer 66 at a fixed potential. During an etching process 100, the conductive layer 66 redistributes charge 20' caused by the non-uniformity of the plasma etch. FIG. 2*f* illustrates a cross-sectional view of the wafer 60. Due to the conductive layer 66 being held at ground, no differences in charge build up have resulted in current flowing through the first via or trench 61 to the second via or trench 63. Therefore, damage due to current flow through the gate oxide layer 69 is mitigated.

After any of the above etching processes, the photoresist layer 68 is then stripped (e.g., ashing in an $O_2$ plasma) to remove remaining portions of the photoresist layer 68. The conductive layer 66 is then removed, for example, using a wet or dry etch. Preferably, the wet or dry etch is high selective to the conductive layer 66 verse the underlying insulating layer and anything exposed at the bottom of the trench or vias. The first via or trench 61 and the second via or trench 63 can be filled with a contact material (e.g., aluminum, aluminum alloy, copper, copper alloy, tungsten, tungsten alloy) so as to form conductive contacts and/or conductive lines. The contact material may then be polished back step to remove a predetermined thickness of the contact material. Alternatively, the conductive layer may be removed during the polished back step removing both the contact material and the underlying conductive material layer 66. Furthermore, the contact material and the conductive layer can be removed employing a metal etch that is highly selective to the contact material and the underlying conductive material layer 66 over the insulating layer 64.

Figure 3A:
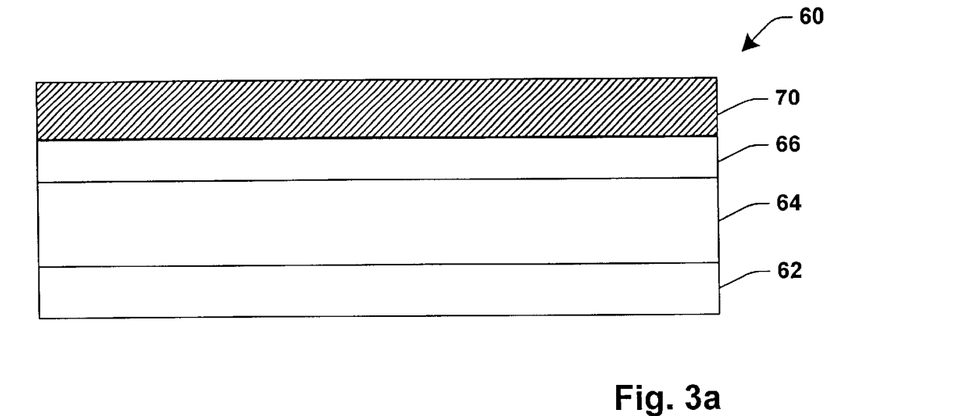
FIG. 3a is a schematic illustration of a semiconductor substrate covered with an oxide layer, a conductive layer and a photoresist layer in accordance with the present invention.
Figure 3B:
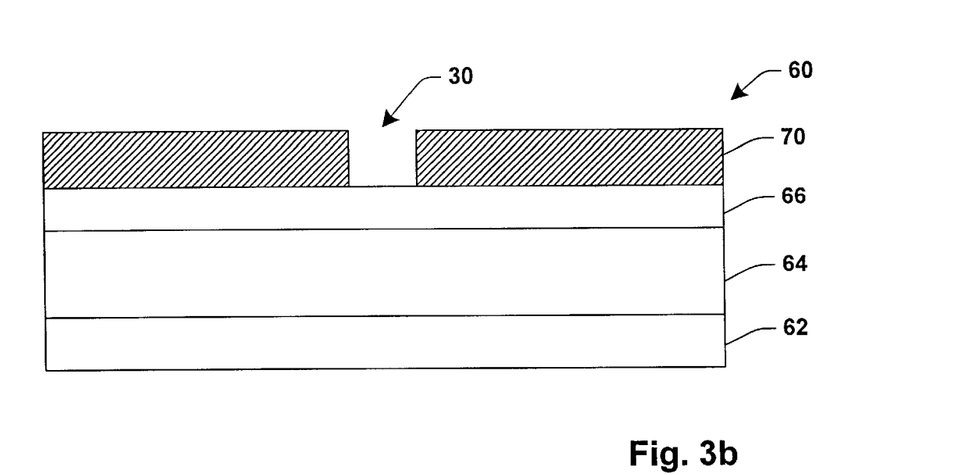
FIG. 3b is a schematic illustration of the photoresist layer of FIG. 3a patterned in accordance with the present invention.
Figure 3C:
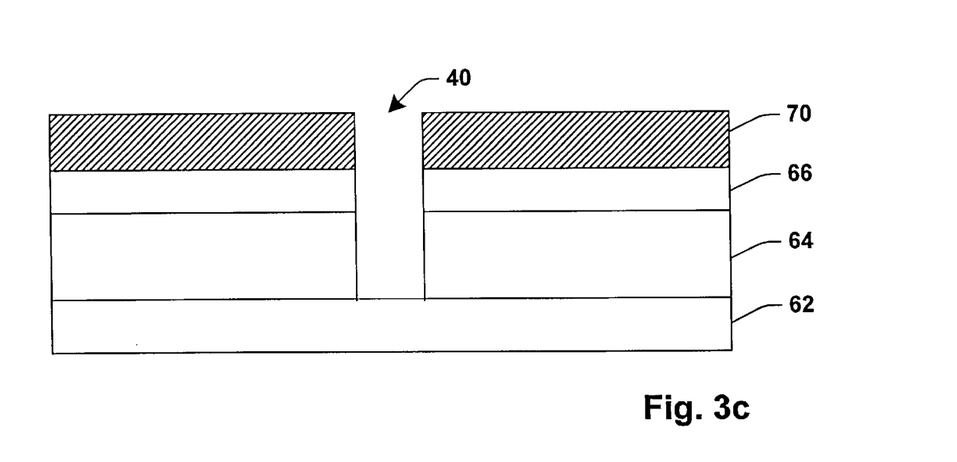
FIG. 3c is a schematic illustration of the structure of FIG. 3b after the conductive layer and the oxide layer has been etched in accordance with the present invention.
Figure 3D:
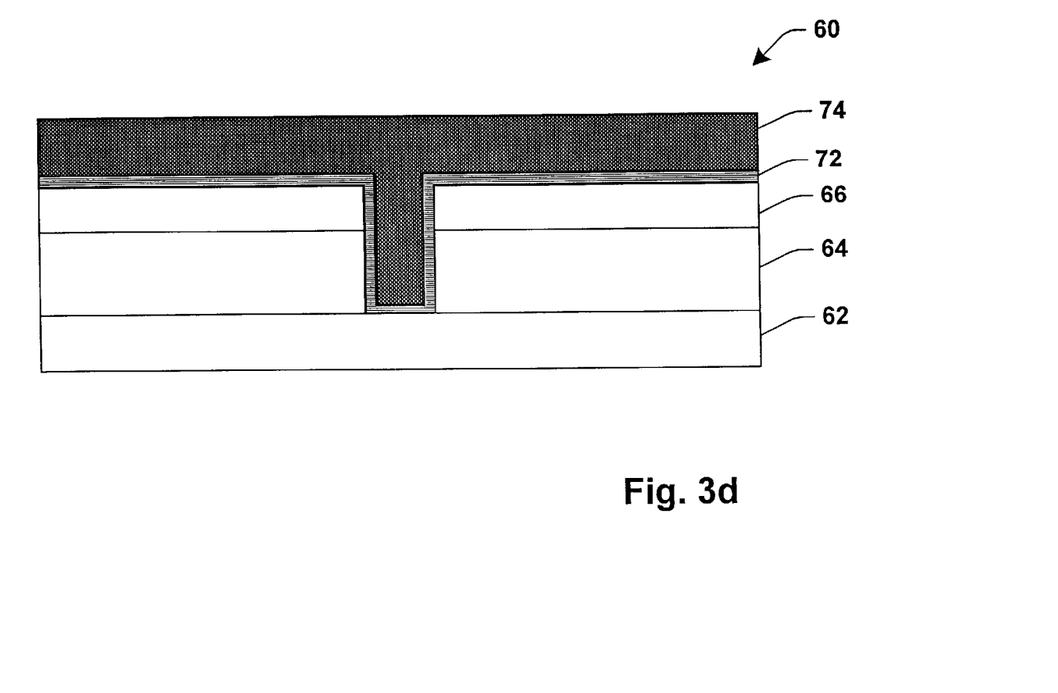
FIG. 3d is a schematic illustration of the structure of FIG. 3c after a titanium or titanium nitride barrier and a tungsten fill have been deposited in accordance with with the present invention.
Figure 3E:
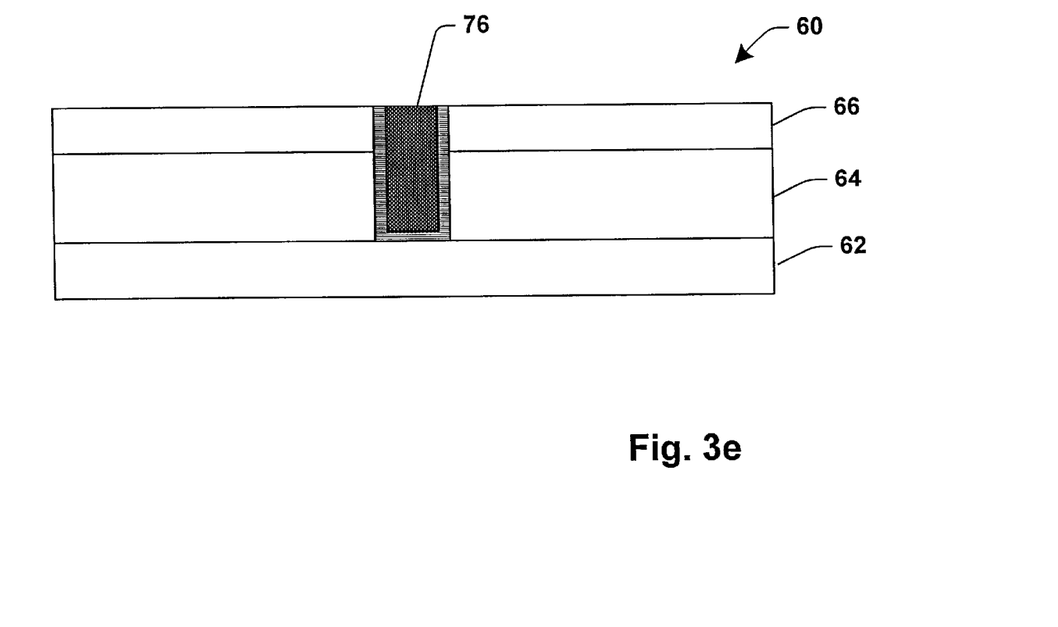
FIG. 3e is a schematic illustration of the structure of FIG. 3d after the titanium or titanium nitride barrier and the tungsten fill have been polished back in accordance with a conventional process.

FIGS. 3*a*–3*e* illustrate a methodology for forming a contact from the conductive layer 66 to the substrate layer 62. The substrate layer 62 acts as a ground to the conductive layer 66. Alternatively, the substrate layer 62 can be held at a fixed potential or the top of the contact held at a fixed potential to mitigate any charge buildup on the photoresist layer 68. Additionally, the substrate layer 62 can be coupled to the ground of the plasma etcher. It is to be appreciate that any number of different methodologies may be employed to couple the substrate layer 62 to a fixed potential. FIG. 3*a* illustrates an insulation layer 64 formed on a silicon layer 62. A conductive layer 66 is formed on the insulation layer 64. A photoresist layer 70 is formed on the conductive layer 66. The photoresist layer 70 is patterned using conventional techniques to form a first opening 30 (FIG. 3*b*). Anisotropic reactive ion etching (RIE) is performed to form a via 40 (FIG. 3*c*) in the conductive layer 66 and the insulation layer 64. After via 40 is etched, the photoresist layer 70 is stripped and a protective barrier layer 72 is deposited over the structure 60. Preferably, the protective barrier layer 72 is comprised of Ti or TiN. A tungsten layer 74 is deposited over the barrier layer 72. The tungsten layer 74 and the barrier layer 72 are then polished away (FIG. 3*e*) to the conductive layer 66 to form a coupling contact 76, which couples the substrate 62 to the conductive layer 66. It is to be appreciated that any conductive material may be employed to form the contact 76 (e.g., aluminum, aluminum alloy, copper, copper alloy, tungsten, tungsten alloy).

Figure 4:
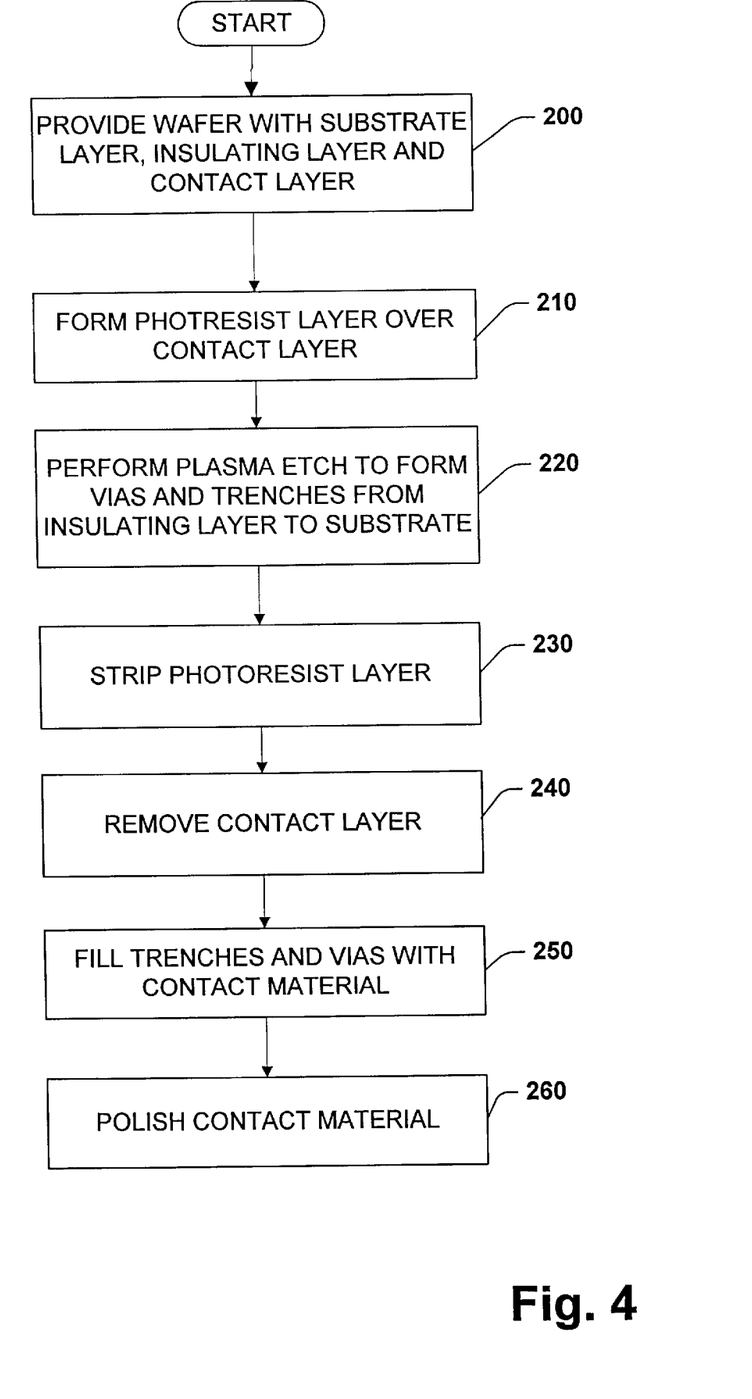
FIG. 4 is a flow diagram illustrating one specific methodology for carrying out the present invention

FIG. 4 is a flow diagram illustrating one particular methodology for carrying out the present invention by providing a conductive layer over an insulating layer and a substrate during a plasma etching process. In step 200, a wafer with a substrate is provided with an insulating layer over the substrate and a conductive layer over the insulating layer. In step 210, a photoresist layer is formed over the conductive layer. A plasma etch is then performed to form vias and trenches from the insulating layer to the substrate in step 220. In step 230, the photoresist layer is stripped. The conductive layer is then removed in step 240, for example, using a wet or dry etch. Preferably, the wet or dry etch is high selective to the conductive layer verse the underlying insulating layer and anything exposed at the bottom of the trench or vias. The trenches are then filled with a contact material layer in step 250 and the contact material is polished down to the insulating material layer in step 260.

Figure 5:
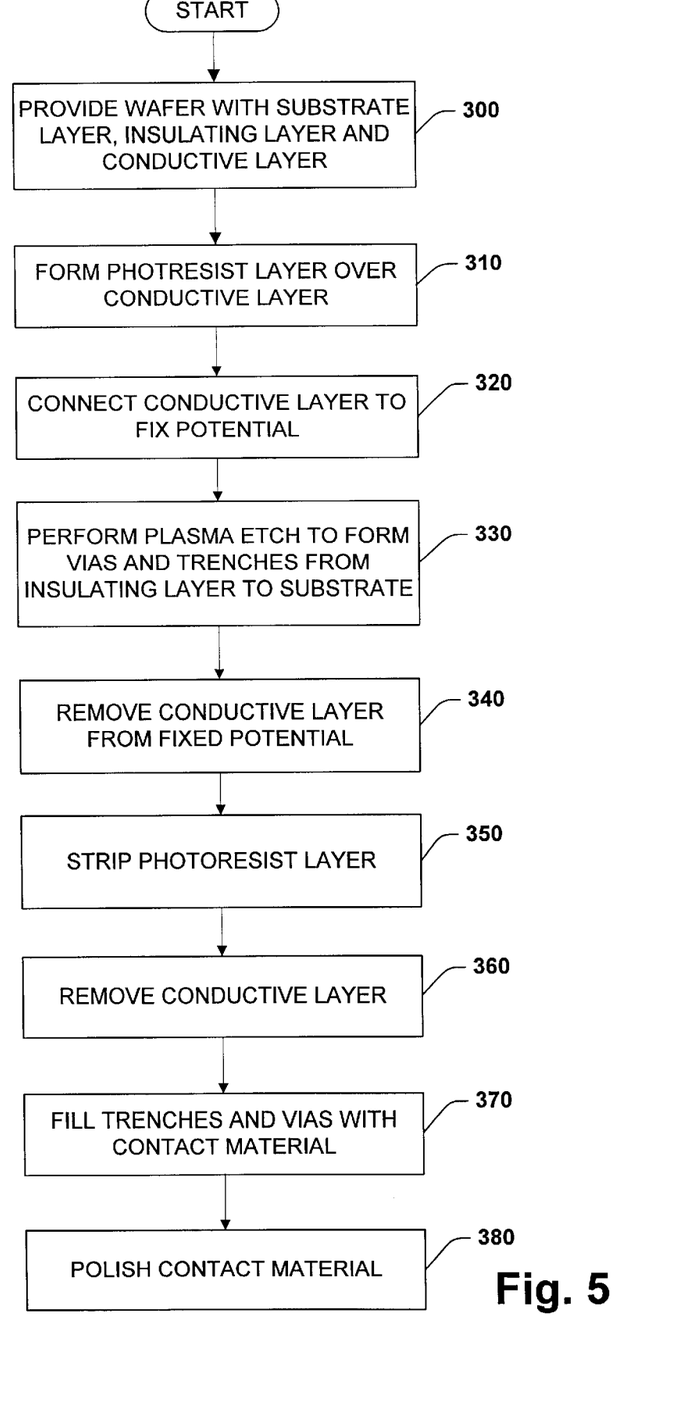
FIG. 5 is a flow diagram illustrating another specific methodology for carrying out the present invention.

FIG. 5 is a flow diagram illustrating another particular methodology for carrying out the present invention by providing a conductive layer over an insulating layer and a substrate during a plasma etching process. In step 300, a wafer with a substrate is provided with an insulating layer over the substrate and a conductive layer over the insulating layer. In step 310, a photoresist layer is formed over the conductive layer. In step 320, the conductive layer is coupled to a fixed potential, for example, by coupling the conductive layer to a ground of the plasma etcher. A plasma etch is then performed to form vias and trenches from the insulating layer to the substrate in step 330. The connection of the conductive layer is then removed in step 340. In step 350, the photoresist layer is stripped. In step 360, the conductive layer is removed, for example, by performing a wet or dry etch on the conductive layer. The trenches are then filled with a contact material layer in step 370 and the contact material is polished down to the insulating material layer in step 380.

Figure 6:
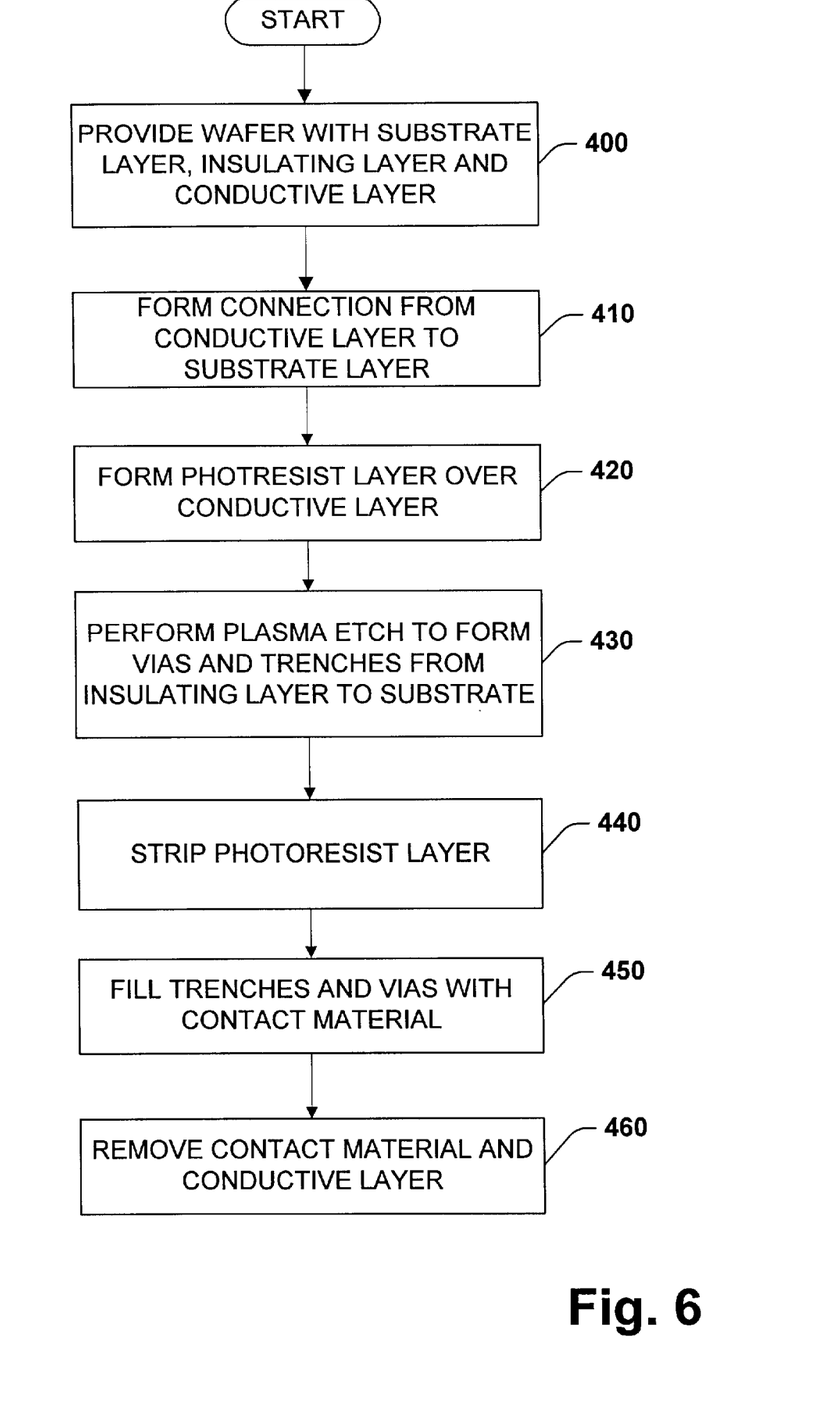
FIG. 6 is a flow diagram illustrating yet another specific methodology for carrying out the present invention.

FIG. 6 is a flow diagram illustrating another particular methodology for carrying out the present invention by providing a conductive layer over an insulating layer and a substrate during a plasma etching process. In step 400, a wafer with a substrate is provided with an insulating layer over the substrate and a conductive layer over the insulating layer. In step 410, the a connection is formed from the conductive layer to the substrate. In step 420, a photoresist layer is formed over the conductive layer. A plasma etch is then performed to form vias and trenches from the insulating layer to the substrate in step 430. In step 440, the photoresist layer is stripped. The trenches are then filled with a contact material layer in step 450. The contact material and conductive layer are then removed down to the insulating material layer in step 460. This can be accomplished by a CMP process or a metal etch as previously described.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating interconnecting lines and vias in a layer of insulating material comprising the steps of:
   providing a substrate having an insulating layer;
   forming a conductive layer over the insulating layer;
   coupling the conductive layer to a fixed potential;
   providing a photoresist layer over the conductive layer;
   developing the photoresist layer exposing portions of the conductive layer; and
   etching exposed portions of the conductive layer and underlying insulating layer to form at least one opening extending to the substrate.

2. The method of claim 1, the conductive layer being a titanium nitride antireflective layer.

3. The method of claim 1, the step of coupling the conductive layer to a fixed potential comprising clamping the conductive layer to a plate holding the substrate.

4. The method of claim 1, the step of coupling the conductive layer to a fixed potential comprising coupling the conductive layer to a ground of a plasma etcher used in performing the step of etching the exposed portions of the conductive layer and the underlying insulating layer.

5. The method of claim 1, further comprising the step of coupling the conductive layer to the substrate prior to forming the photoresist layer over the conductive layer.

6. The method of claim 5, the step of coupling the conductive layer to the substrate comprising forming an opening from the conductive layer to the substrate layer and filling the opening with a contact material.

7. The method of claim 6, the contact material being tungsten.

8. The method of claim 5, the step of coupling the conductive layer to the substrate comprising:
   providing a contact forming photoresist layer over the conductive layer;
   developing the contact forming photoresist layer exposing portions of the conductive layer;
   removing the exposed portions of the conductive layer exposing portions of the insulating layer;
   removing exposed portions of the insulating layer to form a contact via; and
   filling the contact via with a contact metal.

9. The method of claim 8, the contact metal including at least one of tungsten and a tungsten alloy.

10. The method of claim 1, the conductive layer mitigating charges formed on the photoresist layer during the etching of the exposed portions of the conductive layer and the underlying insulating layer due to the nonuniformity of a plasma etch.

11. A method for fabricating interconnecting lines and vias in a layer of insulating material comprising the steps of:
    providing a substrate having an insulating layer;
    forming a conductive layer over the insulating layer;
    coupling the conductive layer to a fixed potential;
    providing a photoresist layer over the conductive layer;
    developing the photoresist layer exposing portions of the conductive layer;
    etching the exposed portions of the conductive layer exposing portions of the insulating layer;
    etching exposed portions of the insulating layer to form a via;
    stripping off the photoresist layer;
    removing the conductive layer; and
    filling the via with a contact material.

12. The method of claim 11, the step of coupling the conductive layer to a fixed potential comprising clamping the conductive layer to a plate holding the substrate.

13. The method of claim 11, the step of coupling the conductive layer to a fixed potential comprising coupling the conductive layer to a ground of a plasma etcher used in performing the step of etching the exposed portions of the insulating layer.

14. The method of claim 11, further comprising the step of coupling the conductive layer to the substrate prior to forming the photoresist layer over the conductive layer.

15. The method of claim 14, the step of coupling the conductive layer to the substrate comprising forming an opening from the conductive layer to the substrate layer and filling the opening with a contact material.

16. The method of claim 15, the contact material being tungsten.

17. A method for fabricating interconnecting lines and vias in a layer of insulating material comprising the steps of:
    providing a substrate having an insulating layer;
    forming a conductive layer over the insulating layer;
    forming a coupling contact from the conductive layer to the substrate;
    coupling the substrate to a fixed potential;
    providing a photoresist layer over the conductive layer;
    developing the photoresist layer exposing portions of the conductive layer;
    etching the exposed portions of the conductive layer exposing portions of the insulating layer;
    etching exposed portions of the insulating layer to form a via;
    stripping off the photoresist layer;
    removing the conductive layer;
    filling the via with a contact material layer, the contact material layer covering the insulating layer; and
    polishing back the contact material layer.

18. The method of claim 17, the step of forming a coupling contact from the conductive layer to the substrate comprising:

providing a contact forming photoresist layer over the conductive layer;

developing the contact forming photoresist layer exposing portions of the conductive layer;

removing the exposed portions of the conductive layer exposing portions of the insulating layer;

removing exposed portions of the insulating layer to form a contact via; and filling the contact via with a contact metal.

19. The method of claim 17, the conductive layer being a titanium nitride antireflective layer.

20. The method of claim 19, the step of coupling the substrate to a fixed potential comprising coupling the substrate to a ground of a plasma etcher used in performing the step of etching the exposed portions of the insulating layer to form a via.

* * * * *